United States Patent
Nakagawa et al.

(10) Patent No.: US 7,641,099 B2
(45) Date of Patent: Jan. 5, 2010

(54) SOLDER JOINT DETERMINATION METHOD, SOLDER INSPECTION METHOD, AND SOLDER INSPECTION DEVICE

(75) Inventors: Hiromitsu Nakagawa, Tokyo (JP); Katsuhiko Mukai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 407 days.

(21) Appl. No.: 11/483,595

(22) Filed: Jul. 11, 2006

(65) Prior Publication Data
US 2007/0017959 A1    Jan. 25, 2007

(30) Foreign Application Priority Data
Jul. 22, 2005    (JP)    ............... 2005-212448

(51) Int. Cl.
B23K 31/12    (2006.01)
(52) U.S. Cl. ..................................... 228/103; 382/150
(58) Field of Classification Search ............... 228/103; 382/150
See application file for complete search history.

(56) References Cited

U.S. PATENT DOCUMENTS 5,166,753 A * 11/1992 Tokura ................ 356/394
6,779,710 B2    8/2004    Igarashi et al.
7,040,526 B2    5/2006    Negishi et al.
2005/0092782 A1    5/2005    Takahashi et al.
2006/0000872 A1    1/2006    Nakagawa et al.
2006/0037991 A1    2/2006    Negishi et al.

FOREIGN PATENT DOCUMENTS

JP    2000-228579    8/2000
JP    2003-101216    4/2003

* cited by examiner

*Primary Examiner*—Jessica L. Ward
*Assistant Examiner*—Nicholas P D'Aniello
(74) *Attorney, Agent, or Firm*—Oblon, Spivak, McClelland, Maier & Neustadt, L.L.P.

(57) ABSTRACT

A solder joint determination method is disclosed that is able to inspect a joint portion between an electrode and a soldered portion and determine a soldering condition of the joint portion reliably with high precision. The method includes the steps of: scanning a surface of the electrode with the light beam; detecting a height of the electrode relative to the circuit board from data of the scanning of the electrode; scanning a surface of the solder near the electrode with the light beam; detecting a height of the solder relative to the circuit board from data of the scanning of the solder; and determining the solder joint condition between the electronic part and the solder based on the height of the electrode and the height of the solder relative to the circuit board.

8 Claims, 10 Drawing Sheets

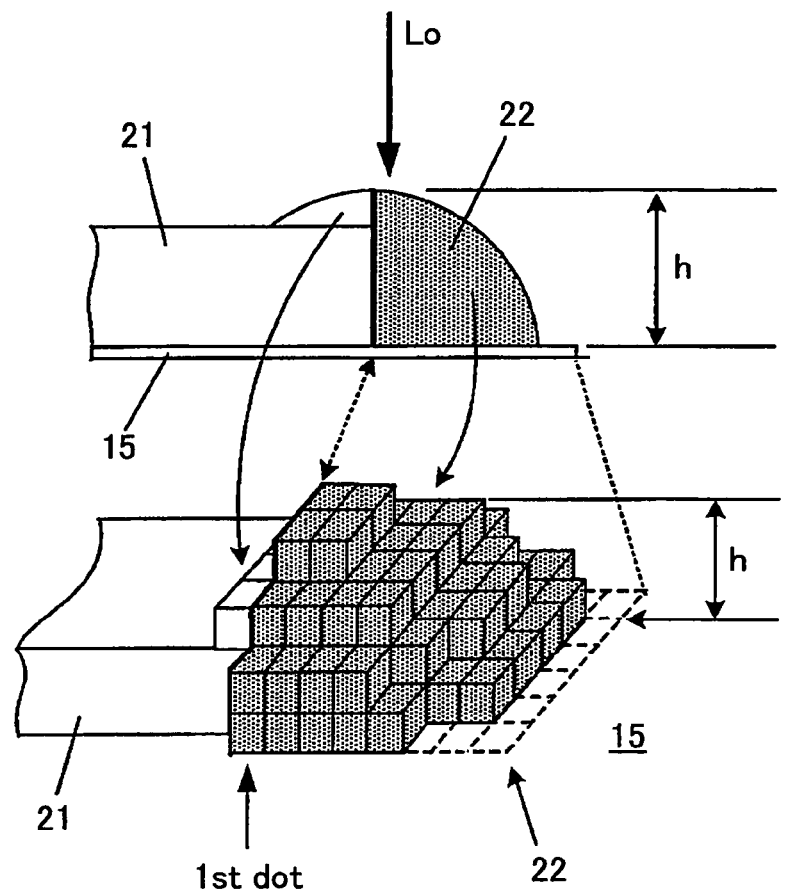
FIG.6A
FIG.6B
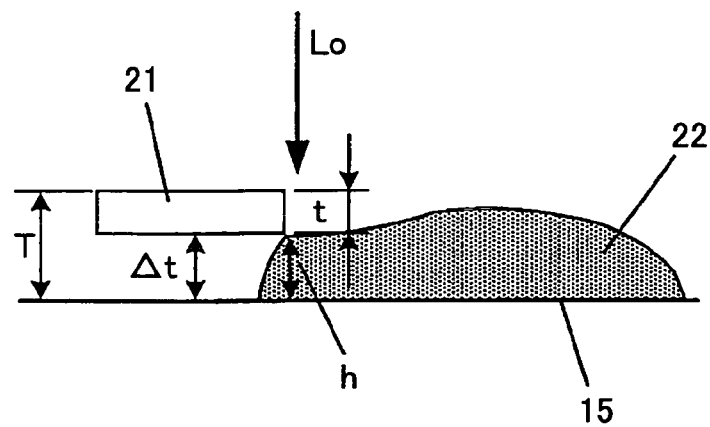
FIG.7

SOLDER JOINT DETERMINATION METHOD, SOLDER INSPECTION METHOD, AND SOLDER INSPECTION DEVICE

This patent application is based on Japanese Priority Patent Application No. 2005-212448 filed on Jul. 22, 2005, the entire contents of which are hereby incorporated by reference.

BACKGROUND OF THE INVENTION

1. Field of the Invention

The present invention relates to a solder joint determination method for inspecting and determining a solder joint condition of an electrode of an electronic part mounted on a circuit board by soldering, a solder inspection method, and a solder inspection device.

2. Description of the Related Art

In the related art, generally, an electrode of an electronic part, which is mounted on a circuit board, is attached to the circuit board by soldering, and in the inspecting step subsequent to the soldering step, it is determined whether the solder and the electrode are joined reliably. In this inspecting step, it is also determined whether there are defective soldering conditions, such as absence of the solder, and lack of wetting.

For example, a solder inspection device irradiates a light beam, such as a laser beam, onto an inspection site, performs optical scanning, measures optical changes of a reflected light beam from the inspection site, and then performs data analysis. From the results, the solder inspection device determines shapes of the inspection sites, locations of the inspection sites, and additionally, calculates lengths and heights of the solder at the soldering sites, and determines positions of parts and lack of wetting.

For example, Japanese Patent Gazette No. 3055161 (hereinafter referred to as "reference 1"), and Japanese Laid-Open Patent Application No. 5-332745 (hereinafter referred to as "reference 2") disclose such a technique.

In these years, as a response of manufacturers to the environmental problems, in the mounting technology, solder free from lead, which is known as "lead-free solder", is more and more used. However, the lead-free solder suffers from a problem in the wetting property compared to the common lead-included solder. For example, Japanese Laid-Open Patent Application No. 2003-101216 (hereinafter referred to as "reference 3") disclose related issues.

FIG. 11 is a schematic view of a solder inspecting device and an inspection site for illustrating a solder inspecting method in the related art.

In FIG. 11, there are a circuit board 1, an electronic part 2 mounted on the circuit board 1, soldered portions 3 which join electrodes 2a of the electronic part 2 with the circuit board 1, a laser 4 which emits a laser beam Lo used for soldering inspection, a deflecting mirror 5 which deflects the laser beam Lo to pass across the soldered portions 3 for scanning, and light receiving elements 6 which receive light beams Lr reflected from the electrodes 2a.

In FIG. 11, the deflecting mirror 5 is driven to deflect the laser beam Lo to pass across the soldered portions 3 in an X direction as shown in FIG. 11, and move the laser beam Lo in a Y direction as shown in FIG. 11, so that the light beams Lr reflected from the electrodes 2a are received by the light receiving elements 6. In the light receiving elements 6, electro-optical conversion is carried out, and the shape of the soldered portions 3 is detected and measured through data processing and image processing; then the measured results are compared with preset conditions to determine soldering conditions.

FIG. 12A through FIG. 12C are front views (upper portion) and plan views (lower portion) of soldered portions for illustrating determination results by the solder inspecting method as shown in FIG. 11.

In the solder inspecting method of the related art, the laser beam Lo is scanned to pass across two sites (indicated by circles) of the soldered portions 3. As shown in FIG. 12A, there is a portion (indicated by "A") having an inclined surface at the end of the soldered portion 3, and a flat portion (indicated by "B") near the center portion of the soldered portion 3. It is determined that the soldering condition is good if the soldered portion 3 has such a shape.

Therefore, if the soldering condition is like that in FIG. 12A, it can be determined that the soldering condition is good by visual inspection and by an inspection with a soldering inspection device of the related art.

If the soldering condition is like that in FIG. 12C, it can be determined that the soldering condition is not good by visual inspection and by the inspection with the soldering inspection device of the related art.

However, if the soldering condition is like that in FIG. 12B, since the soldered portion 3 is connected with the electrode 2a, it is determined that the soldering condition is good by visual inspection, but it is determined that the soldering condition is not good by the inspection with the soldering inspection device of the related art, since the soldering condition in FIG. 12B is not in agreement with the preset good soldering conditions.

That is, in the related art, the soldering inspection device suffers from problems in precision and accuracy compared to visual inspection.

Additionally, when the lead-free solder is used for soldering, as described above, the lead-free solder suffers from the problem in that the wetting property is degraded compared to the common lead-included solder. Due to this, it is desirable that inspection of the joint portion between the electrodes 2a and the soldered portions 3 by using an inspection device and determination of good soldering condition be made with high precision.

SUMMARY OF THE INVENTION

The present invention may solve one or more problems of the related art.

A preferred embodiment of the present invention may provide a solder joint determination method able to inspect a joint portion between an electrode and a soldered portion and determine a soldering condition of the joint portion with high precision, a solder inspection method, and a solder inspection device.

According to a first aspect of the present invention, there is provided a solder joint determination method for determining a solder joint condition between an electronic part and a piece of solder with a light beam irradiating onto the electronic part, said electronic part having an electrode mounted on a circuit board by the solder, said solder joint determination method comprising the steps of:

scanning a surface of the electrode with the light beam;

detecting a height of the electrode relative to the circuit board from data of the scanning of the electrode;

scanning a surface of the solder near the electrode with the light beam;

detecting a height of the solder relative to the circuit board from data of the scanning of the solder; and determining the solder joint condition between the electronic part and the solder based on the height of the electrode and the height of the solder relative to the circuit board.

According to an embodiment of the present invention, since the solder joint condition between the electronic part and the solder is determined based on the height of the electrode and the height of the solder relative to the circuit board, it is possible to improve the accuracy of the determination.

As an embodiment, in the step of determining, a distance of a bottom surface of the electrode from the circuit board is calculated based on the height of the electrode relative to the circuit board, and the solder joint condition is determined to be poor when the distance of the bottom surface of the electrode from the circuit board is greater than the height of the solder relative to the circuit board.

According to the present embodiment, since the solder joint condition is determined depending on whether the electrode is separated from the solder, it is possible to determine the solder joint condition reliably.

As an embodiment, the distance of the bottom surface of the electrode from the circuit board is calculated from a thickness of the electrode and the height of the electrode relative to the circuit board.

According to the present embodiment, it is possible to easily determine the distance of the bottom surface of the electrode from the circuit board.

As an embodiment, in the step of detecting the height of the solder relative to the circuit board, the light beam is scanned to pass across the solder, a cross-sectional shape of the solder is obtained from data of scanning the solder, and the height of the solder relative to the circuit board is determined based on the cross-sectional shape of the solder.

According to the present embodiment, it is possible to optically detect the height of the solder relative to the circuit board easily.

As an embodiment, in the step of detecting the height of the solder relative to the circuit board, the height of the solder relative to the circuit board is determined based on scanning data of an initial scanning line on the surface of the solder near the electrode.

According to the present embodiment, it is possible to obtain data, which are used for determining the solder joint condition between the electrode and the solder, at a site where the electrode and the solder are closest to each other.

As an embodiment, the solder does not include lead.

According to the above embodiments, since it is possible to reliably determine the solder joint condition between the electrode and the solder, this method is applicable to solder joint condition determination of lead-free solder, which has a degraded wetting property compared to common solder including lead.

According to a second aspect of the present invention, there is provided a solder inspection method for inspecting a solder joint condition between an electronic part and a piece of solder with a light beam irradiating the electronic part, said electronic part having an electrode mounted on a circuit board by the solder, said solder inspection method comprising the steps of:

scanning a surface of the electrode with the light beam;

detecting a height of the electrode relative to the circuit board from data of the scanning of the electrode;

scanning a surface of the solder near the electrode with the light beam;

detecting a height of the solder relative to the circuit board from data of the scanning of the solder; and determining the solder joint condition between the electronic part and the solder based on the height of the electrode and the height of the solder relative to the circuit board.

As an embodiment, in the step of determining, a distance of a bottom surface of the electrode from the circuit board is calculated based on the height of the electrode relative to the circuit board, and the solder joint condition is determined to be poor when the distance of the bottom surface of the electrode from the circuit board is greater than the height of the solder relative to the circuit board.

As an embodiment, the distance of the bottom surface of the electrode from the circuit board is calculated from a thickness of the electrode and the height of the electrode relative to the circuit board.

As an embodiment, in the step of detecting the height of the solder relative to the circuit board, the light beam is scanned to pass across the solder, a cross-sectional shape of the solder is obtained from data of scanning the solder, and the height of the solder relative to the circuit board is determined based on the cross-sectional shape of the solder.

As an embodiment, in the step of detecting the height of the solder relative to the circuit board, the height of the solder relative to the circuit board is determined based on scanning data of an initial scanning line on the surface of the solder near the electrode.

As an embodiment, the solder does not include lead.

According to a third aspect of the present invention, there is provided a solder inspection device for inspecting a solder joint condition between an electronic part and a piece of solder with a light beam irradiating the electronic part, said electronic part having an electrode mounted on a circuit board by the solder, said solder inspection device comprising:

an electrode height detection unit that scans a surface of the electrode with the light beam, and detects a height of the electrode relative to the circuit board from data of the scanning of the electrode;

a solder height detection unit that scans a surface of the solder near the electrode with the light beam, and detects a height of the solder relative to the circuit board from data of the scanning of the solder; and a determination unit that determines the solder joint condition between the electronic part and the solder based on the height of the electrode and the height of the solder relative to the circuit board.

As an embodiment, the determination unit calculates a distance of a bottom surface of the electrode from the circuit board based on the height of the electrode relative to the circuit board, compares the distance of the bottom surface of the electrode from the circuit board with the height of the solder relative to the circuit board, and determine the solder joint condition to be poor when the distance of the bottom surface of the electrode from the circuit board is greater than the height of the solder relative to the circuit board.

As an embodiment, the determination unit calculates the distance of the bottom surface of the electrode from the circuit board from a thickness of the electrode and the height of the electrode relative to the circuit board.

As an embodiment, the solder height detection unit includes:

a light emission part that scans the light beam to pass across the solder, a light receiving part that receives light reflected from the light emission part, and a calculation part that calculates a cross-sectional shape of the solder from scanning data given by the light receiving part, and calculates the height of the solder relative to the circuit board based on the cross-sectional shape of the solder.

As an embodiment, the calculation part calculates the height of the solder relative to the circuit board based on scanning data of an initial scanning line on the surface of the solder near the electrode.

As an embodiment, the solder does not include lead.

According to an embodiment of the present invention, the height of the electrode and the height of the solder relative to the circuit board are measured, and the solder joint condition is determined depending on whether the bottom surface of the electrode is separated from the solder, so that it is possible to improve the accuracy of the solder joint determination, and improve reliability of a lack of wetting inspection of an automatic solder inspection device.

These and other objects, features, and advantages of the present invention will become more apparent from the following detailed description of preferred embodiments given with reference to the accompanying drawings.

BRIEF DESCRIPTION OF THE DRAWINGS

FIG. 6A is a schematic side view for explaining a soldered portion in an electronic part;

FIG. 6B is a schematic perspective view for explaining scanning lines of the laser beam Lo in units of dots (the size of the dots depends on resolution, data processing capability, and other factors);

FIG. 7 is a schematic side view for explaining the method of determining the solder joint condition of the present embodiment;

DESCRIPTION OF THE PREFERRED EMBODIMENTS

Below, preferred embodiments of the present invention are explained with reference to the accompanying drawings.

Figure 1:
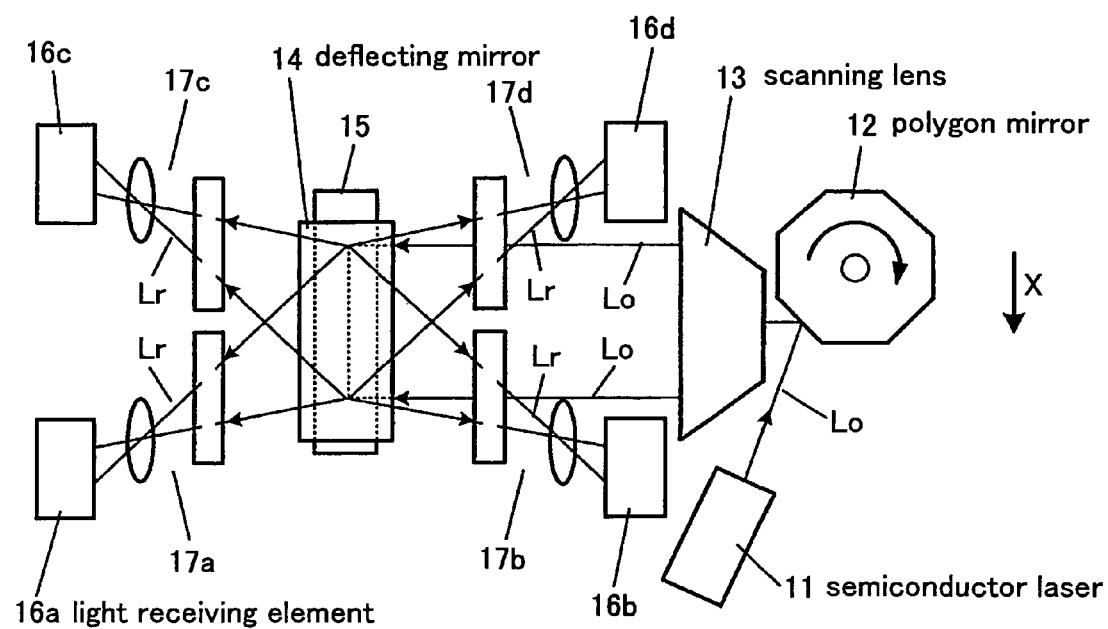
FIG. 1 is a plan view illustrating a schematic configuration of an inspecting optical system of a solder inspecting device according to an embodiment of the present invention.

FIG. 1 is a plan view illustrating a schematic configuration of an inspecting optical system of a solder inspecting device according to an embodiment of the present invention.

Figure 2:
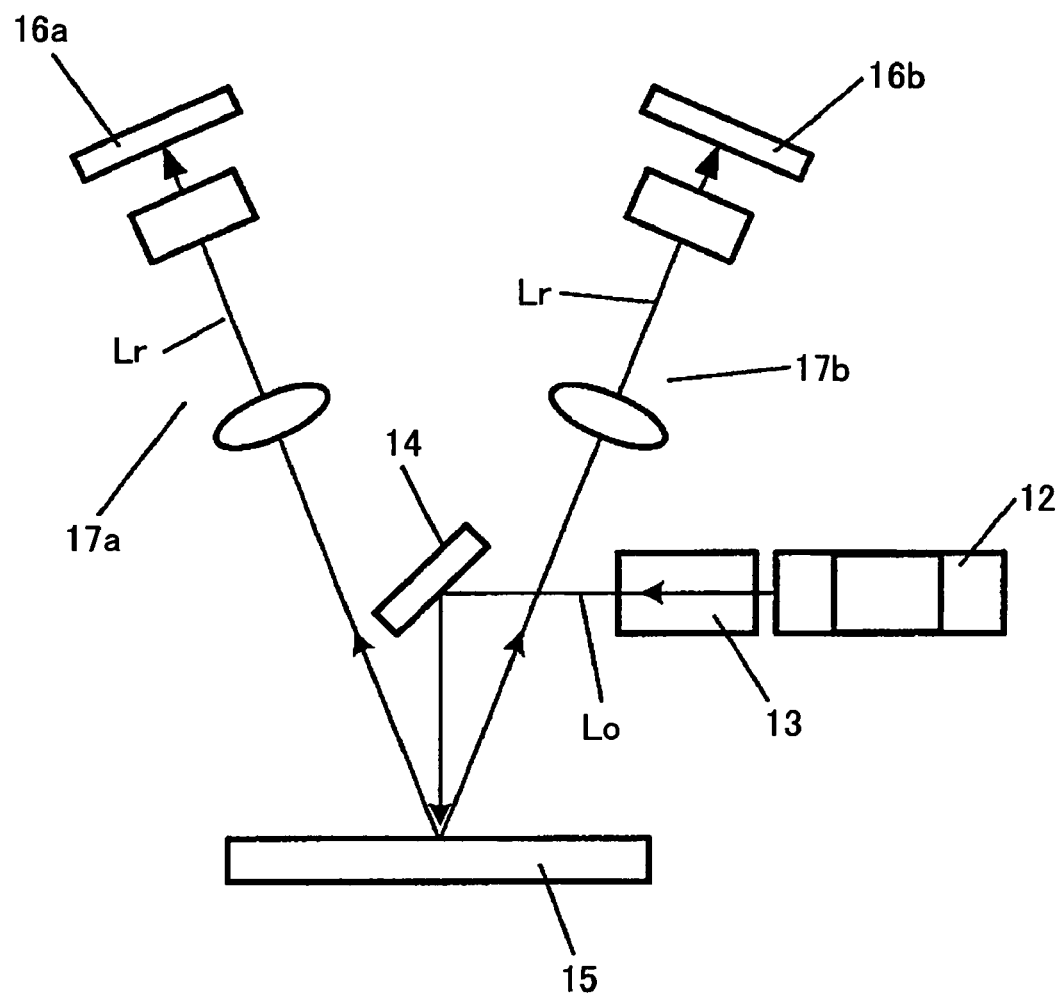
FIG. 2 is a side view illustrating the schematic configuration of the inspecting optical system as shown in FIG. 1.

FIG. 2 is a side view illustrating the schematic configuration of the inspecting optical system as shown in FIG. 1.

The inspecting optical system shown in FIG. 1 and FIG. 2 includes a light source 11, such as a semiconductor laser, a polygon mirror 12, which is a rotating polygonal mirror driven to rotate by a driving motor to deflect the laser beam Lo from the semiconductor laser 11 in an X direction, a scanning lens 13, which is arranged on the outgoing side of the polygon mirror 12 to scan the laser beam Lo while the polygon mirror 12 is rotating, a deflecting mirror 14, which deflects the laser beam Lo from the scanning lens 13 so that the laser beam is perpendicularly incident on a circuit board 15, light receiving elements 16a through 16d which receive light beams Lr reflected by the circuit board 15 in four directions, and four sets of lenses 17a through 17d for condensing the reflected light beams Lr to the light receiving elements 16a through 16d.

For example, the light receiving elements 16a through 16d are PSDs (Position Sensitive Device).

Figure 3:
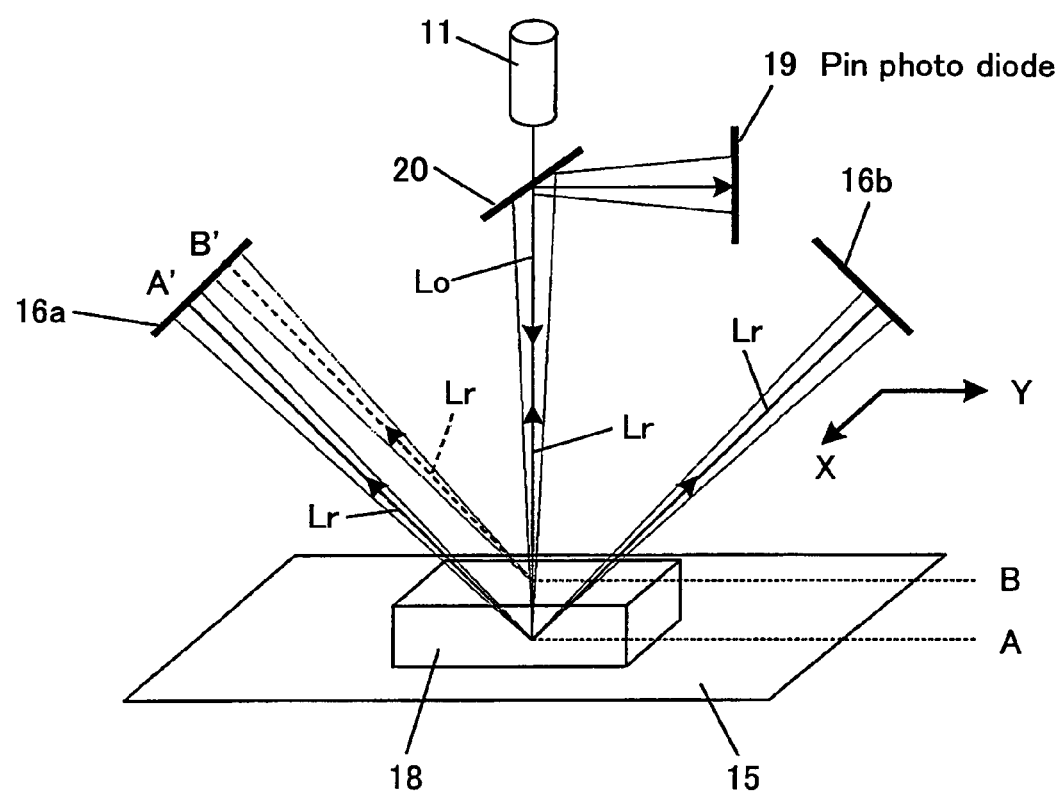
FIG. 3 is a schematic diagram illustrating the principle of measurement and inspection of a solder joint condition.

FIG. 3 is a schematic view illustrating the principle of measurement and inspection of a solder joint condition.

In FIG. 3, there are an electronic part 18, which has an electrode and is mounted on the circuit board 15, a pin photo diode 19 (not illustrated in FIG. 1 and FIG. 2), and a half mirror 20. For convenience of description, only two of the four light receiving elements 16a through 16d are illustrated in FIG. 3.

Below, a measurement method of the present embodiment is described with reference to FIG. 1, FIG. 2, and FIG. 3.

The laser beam Lo emitted from the semiconductor laser 11 is perpendicularly incident on the circuit board 15 through the polygon mirror 12, the scanning lens 13, and the deflecting mirror 14. The laser beam Lo is scanned in a transverse direction (X direction as shown in FIG. 1 and FIG. 3) on the circuit board 15, specifically, on the surface of the circuit board 15, or on the electronic part 18 mounted on the circuit board 15, or on the electrode of the electronic part 18 and a soldered portion. Light Lr diffused and reflected during the scanning is received by the light receiving elements 16a through 16d.

As shown in FIG. 3, a portion of the laser beam Lo is perpendicularly incident on the circuit board 15, is returned to and deflected by the half mirror 20, and the light deflected from the half mirror 20 is received by the pin photo diode 19.

Flux of light received by the light receiving elements 16a through 16d changes along with the height of the position where reflection occurs. For example, in FIG. 3, if the height of the reflection position changes from A to B, the light receiving position on the first light receiving element 16a changes from A' to B'. If a change of the height is detected by the transverse scanning, height data (height image) can be obtained, which represents the height.

Depending on the brightness levels of the light received by the four light receiving elements 16a through 16d, luminance data, which represent the brightness, can be obtained, which may include images of maximum brightness, images of middle brightness, and images of minimum brightness, denoted by luminance Max data, luminance Mid data, and luminance Min data, respectively.

In addition, according to the brightness levels detected by the pin photo diode 19, data (images) representing declination levels and brightness levels can be obtained.

The scanning of the laser beam Lo in the X direction is realized by the polygon mirror 12, and the scanning of the laser beam Lo in the Y direction is realized by moving a not-illustrated table with the circuit board 15 placed thereon. In this way, the whole area of an object can be scanned.

Figure 4A:
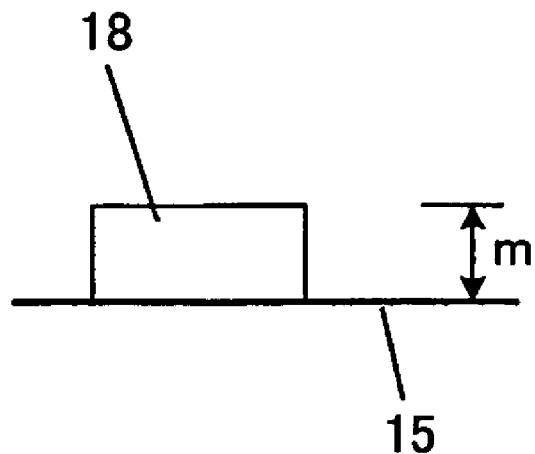
FIG. 4A through FIG. 4C are schematic diagrams showing examples of measurements of height, position, and length by scanning in the inspecting optical system of the present embodiment.
Figure 4B:
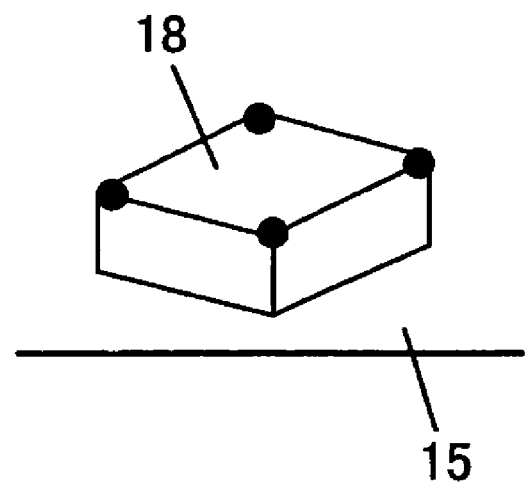
Figure 4C:
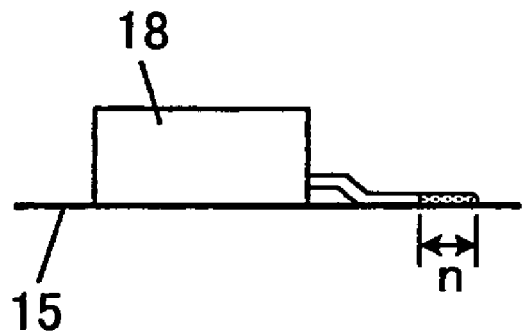

FIG. 4A through FIG. 4C are schematic views showing examples of measurements of height, position, and length by scanning in the inspecting optical system of the present embodiment.

By making calculations with the above data, for example, as shown in FIG. 4A, with reference to height data, the height m of the electronic part 18 from the circuit board 15 is obtained. Additionally, as shown in FIG. 4B, with reference to height data at four positions, the shape of the electronic part 18, or the mounting position is obtained. Additionally, as shown in FIG. 4C, with reference to luminance Min data and the declination and brightness data, the length n of the solder in the soldered portion is obtained.

Similarly, the height, length, and position of the electrode of the electronic part 18, and the height, length, and position of the soldered portion can be measured.

Processing of the above data can be performed by well-known methods of image processing and data processing.

Below, descriptions are made of a soldering process and a solder joint inspection process according to the present embodiment.

Figure 5:
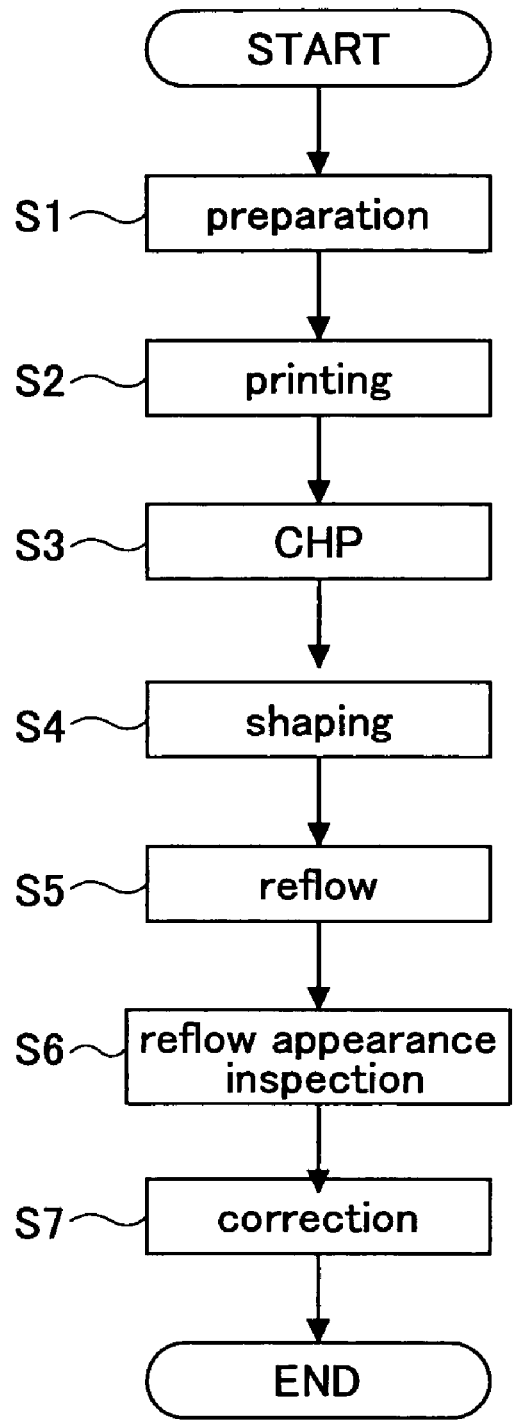
FIG. 5 is a flowchart illustrating a reflow soldering process in the present embodiment.

FIG. 5 is a flowchart illustrating a reflow soldering process in the present embodiment.

In a preparation step S1, the circuit board is masked by using a masking tape or the like, so that solder does not adhere to the object site for the reflow soldering.

In a printing step S2, a soldering pattern of cream solder is printed on the object site.

In a CHP step S3 for arranging an electronic part, the electronic part is placed on a corresponding soldering pattern.

In a shaping step S4, a lead electrode of the electronic part 18 is shaped to be a certain shape.

In a reflow step S5, the cream solder is fused and solidified, and the electrode of the electronic part 18 is connected to the circuit of the circuit board 15, and is fixed.

In a reflow appearance inspection step S6, measurements and inspections of solder joint conditions are carried out, as shown in FIG. 1, FIG. 2, FIG. 3, and FIG. 4A through FIG. 4C.

In a correction step S7, according to the measurement and inspection results, corrections are made when necessary.

In the present embodiment, in the reflow appearance inspection step, solder joint conditions are inspected. Details of the measurements and inspections are described below.

FIG. 6A is a schematic side view for explaining a soldered portion in an electronic part.

FIG. 6B is a schematic perspective view for explaining scanning lines of the laser beam Lo in units of dots (the size of the dots depends on resolution, data processing capability, and other factors).

In FIG. 6A and FIG. 6B, reference number 21 represents an electrode, such as a lead electrode of the electronic part 18, and reference number 22 represents solder attached to the circuit board 15 by reflow soldering.

In the present embodiment, the height of the solder 22 near the electrode 21 is measured. Specifically, as shown in FIG. 6B, from a height image of a first scanning line, which represents an end of the electrode and the first dot line of the detection data, and in which the scanning position of the laser beam Lo changes from the end of the electrode 21 to the solder 22, solder height data at the first scanning line is obtained. From the solder height data, the height (h) of solder near the electrode 21 is measured by well-known methods.

FIG. 7 is a schematic side view for explaining the method of determining the solder joint condition of the present embodiment.

With the solder height h of solder near the electrode 21 relative to the circuit board 15, which is obtained from the solder height data, the electrode height T relative to the circuit board 15, which is measured by well-known methods, and a thickness t of the electrode 21, the distance $\Delta t$ from the circuit board 15 to the bottom surface of the electrode 21 (below, referred to as "electrode bottom height") can be obtained.

The electrode bottom height $\Delta t$ and the solder height h are compared; if h is greater than $\Delta t$, it indicates that the bottom surface of the electrode 21 and the upper surface of the solder 22 are joined together. Namely, if $h > \Delta t$, the solder joint condition is good. To the contrary, if $h < \Delta t$, it can be determined that the solder joint condition is poor. If $h = \Delta t$, it indicates that the bottom surface of the electrode 21 is on the upper surface of the solder 22, and this is not a stable state. Concerning whether the joint condition is good or not, the criterion can be appropriately changed depending on the properties of materials of the solder and the electrode.

The inspection of the solder joint condition can be automatically carried out by a solder inspection device.

Figure 8:
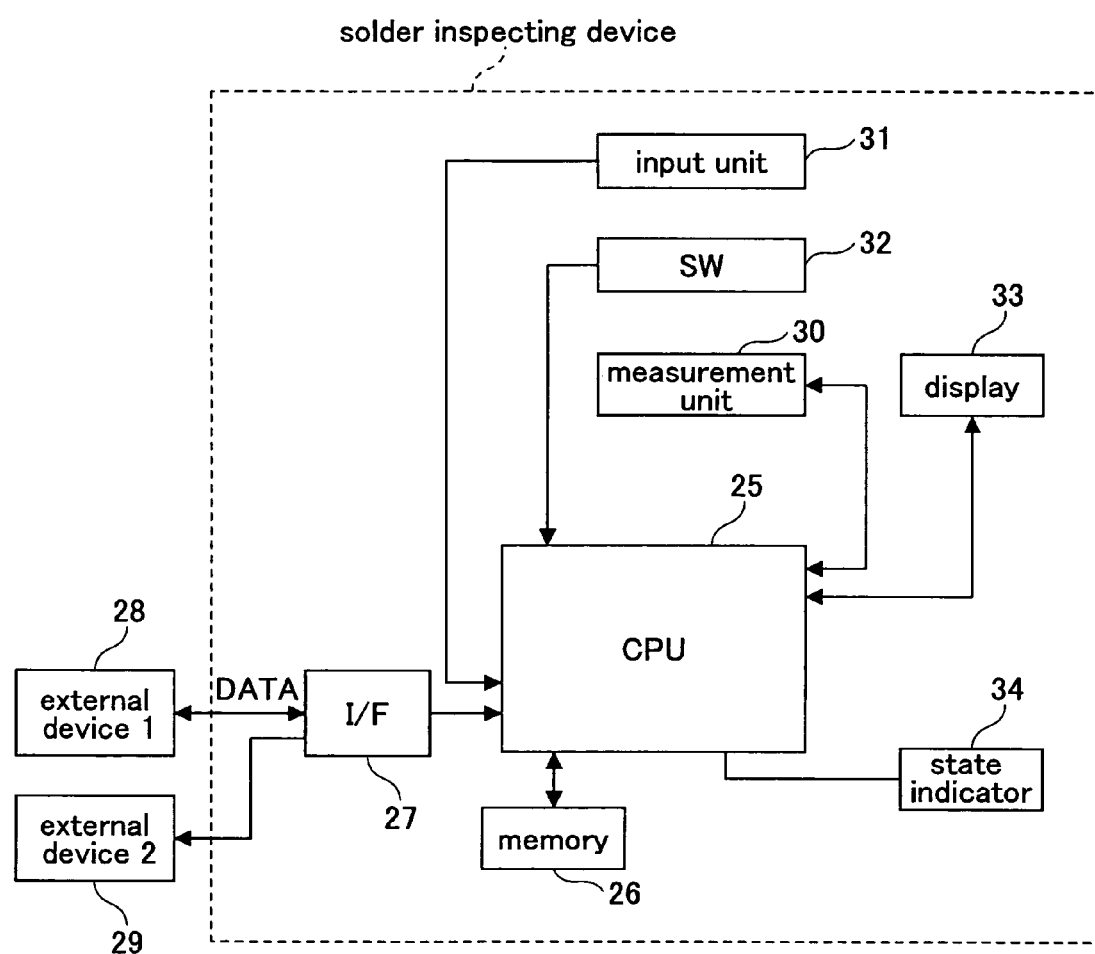
FIG. 8 is a block diagram illustrating a configuration of a solder inspecting device of the present embodiment.

FIG. 8 is a block diagram illustrating a configuration of a solder inspecting device of the present embodiment.

In FIG. 8, the solder inspecting device includes a CPU (Central Processing Unit) 25 which carries out calculations for various measurements and inspections; a memory 26, such as a ROM, RAM, EEPROM, readable by the CPU 25, in which there are stored programs for instructing the CPU 25 to execute measurement and inspection procedures to realize the method of the present embodiment; programs for instructing the CPU 25 to carry out calculations in data processing and to control and drive operations of components of the device; an interface (I/F) 27 for external devices; a first external device 28 for inputting predetermined data, such as thicknesses, and specification data of the electronic part and a circuit board; a second external device 29 for carrying out post processing after receiving the inspection results; a measurement unit 30 formed from the inspecting optical system as described in FIG. 1 through FIG. 3; a data input unit 31 attached to a main body of the device, such as a keyboard, a mouse, and others; a set of switches 32 including main switches on the main body of the device and switches for emergency stop; a display 33 for displaying operational status, setting conditions, inspection results, and others; and an indicator 34 for displaying the operational status in the form of signals.

Figure 9:
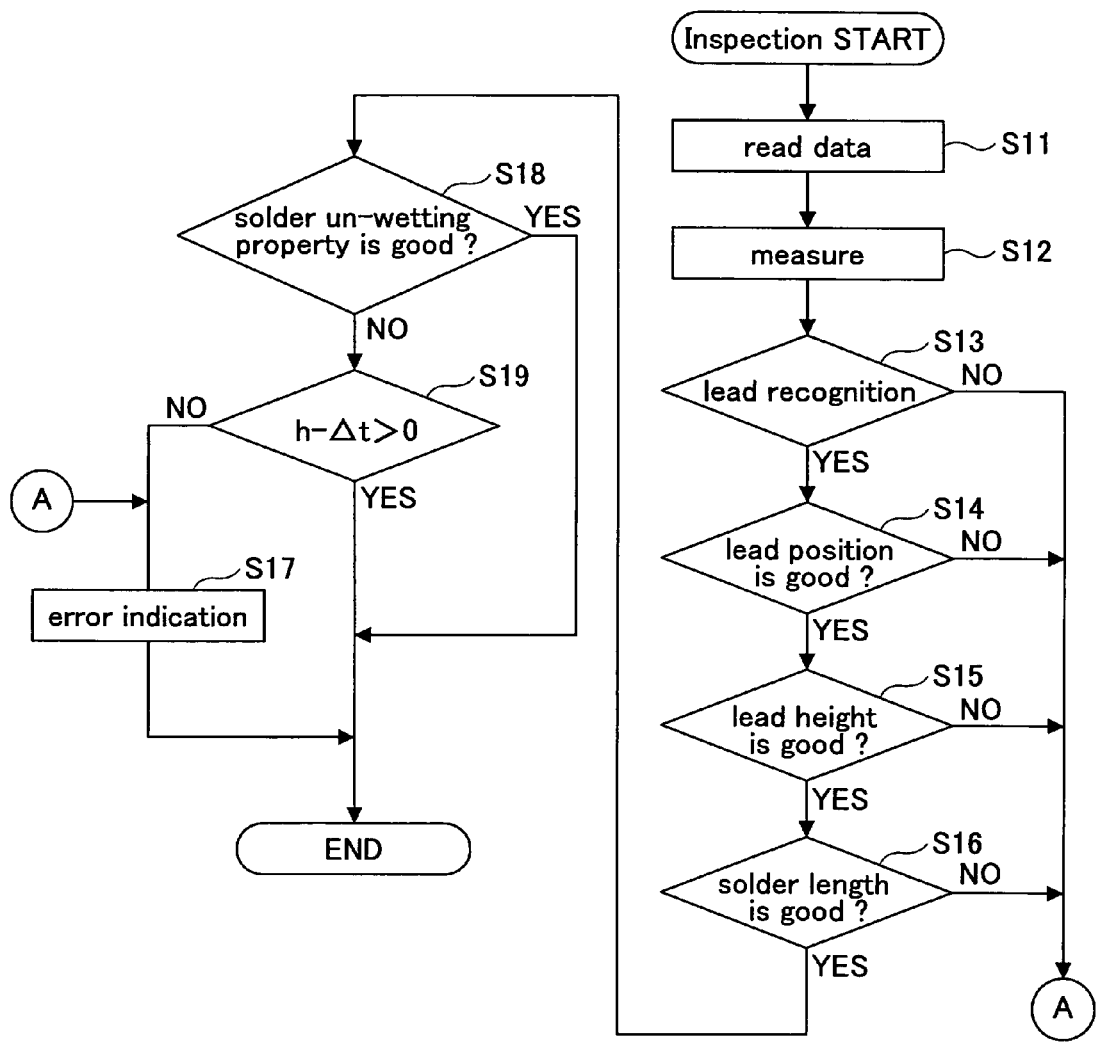
FIG. 9 is a flowchart explaining operations of the solder inspection device of the present embodiment.

FIG. 9 is a flowchart explaining operations of the solder inspection device of the present embodiment.

In step S11, before the inspection, the CPU 25 receives predetermined data, such as thicknesses and specification data of the electronic part and the circuit board in use through the interface (I/F) 27, and stores the data in the memory 26. When the inspection starts, data necessary to the inspection are read in.

In step S12, the inspecting optical system is in operation, and various data are measured by the measurement unit 30, such as the height data, length data, and position data of the components such as the portions in FIG. 4A through FIG. 4C.

In step S13, the CPU 25 receives the above data, and to determines whether the electrode 21 is present.

In step S14, the CPU 25 determines whether the electrode 21 is at a preset position.

In step S15, the CPU 25 determines whether the height of the electrode 21 is in a preset range.

In step S16, the CPU 25 determines whether the length of the solder 22 is in a preset range.

In step S17, if any one of the above data is not in a preset range, the display 33 displays an error message.

Next, in step S18, the CPU 18 determines the solder joint condition (lacks wetting) between the electrode 21 and the solder 22.

If it is determined the solder joint condition is not good (No in step S18), the solder joint condition determination procedure is carried out as described in FIG. 7 according to the present embodiment in step S19.

In step S19, as shown in FIG. 6B, from a height image of a first scanning line, which represents an end of the electrode and the first dot line of the detection data, and in which the scanning position of the laser beam Lo changes from the end of the electrode 21 to the solder 22, the CPU calculates the solder height (h) near the electrode 21. Further, from the height image of the electrode 21, the CPU 25 calculates the height T of the electrode 21 relative to the circuit board 15.

In addition, the CPU 25 reads the thickness t of the electrode 21 from the data input to the memory 26, the electrode bottom height Δt (T-t) is calculated, and the electrode bottom height Δt and the solder height h are compared. If h is greater than Δt, it indicates that the bottom surface of the electrode 21 and the upper surface of the solder 22 are joined together, namely, the solder joint condition is good. If h<Δt, it indicates a poor solder joint.

If it is determined the solder joint condition is poor, the display 33 displays an error message, as shown in step S17.

Figure 10A:
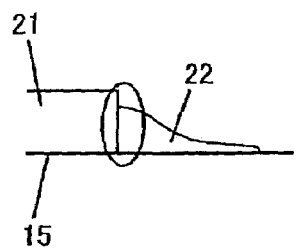
FIG. 10A through FIG. 10C are schematic views for explaining solder joint conditions in the present embodiment.
Figure 10B:
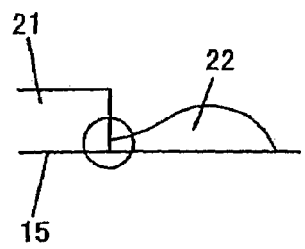
Figure 10C:
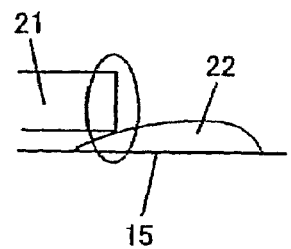
Figure 11:
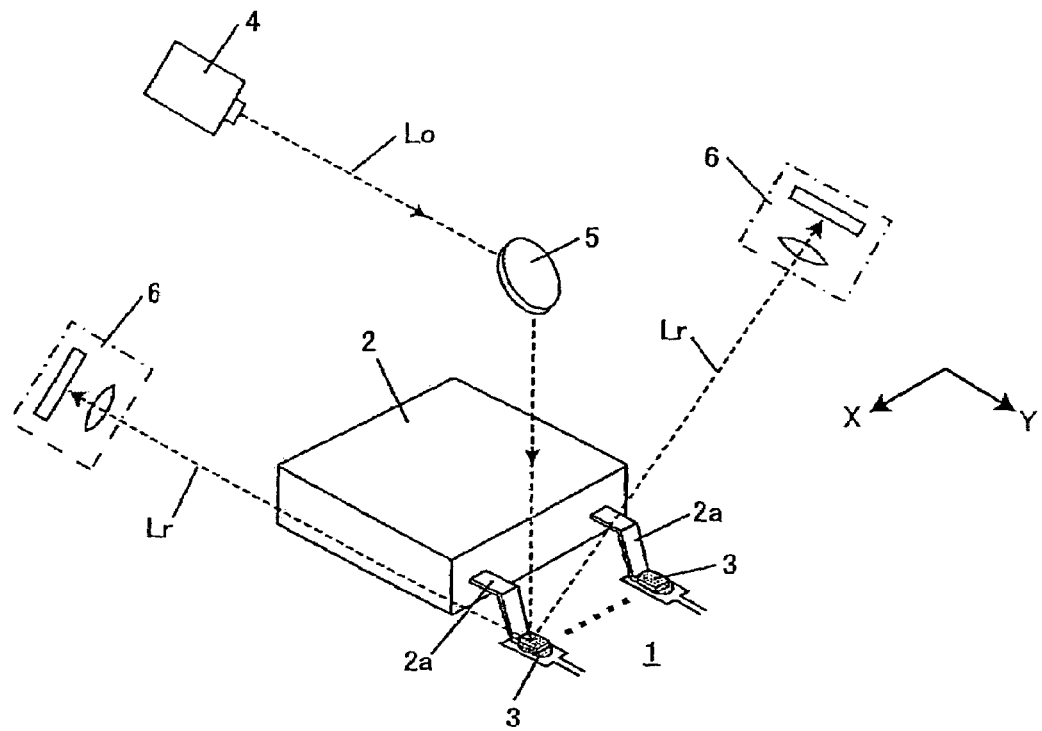
FIG. 11 is a schematic view of a solder inspecting device and an inspection site for illustrating a solder inspecting method in the related art.
Figure 12A:
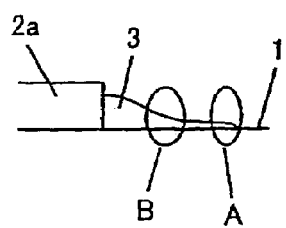
FIG. 12A through FIG. 12C are side views (upper portion) and plan views (lower portion) of soldered portions for illustrating determination results by the solder inspecting method as shown in FIG. 11.
Figure 12B:
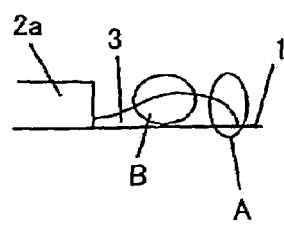
Figure 12C:
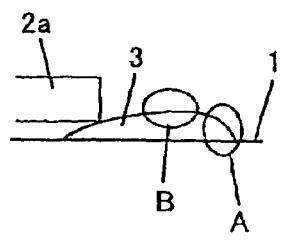
Figure 12C:
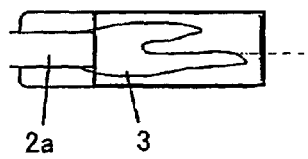
Figure 12C:
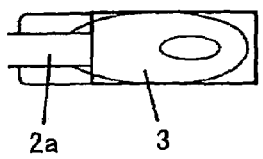
Figure 12C:
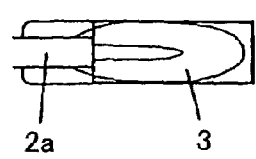

FIG. 10A through FIG. 10C are schematic views for explaining solder joint conditions in the present embodiment.

As described above, in the present embodiment, based on the height h of the solder relative to the circuit board 15 near the electrode 21, the solder joint conditions of the portions enclosed by circles in FIG. 10A through FIG. 10C can be determined reliably with high precision. Specifically, the solder joint conditions in FIG. 10A and FIG. 10B are certainly determined to be good, and even in FIG. 10B, because the solder joint condition is determined by whether the bottom surface of the electrode 21 is in contact with the upper surface of the solder 22, it is possible to determine the solder joint condition reliably and accurately compared to the solder inspecting device of the related art.

In addition, the solder inspecting program of the present embodiment, which is stored in the memory 26, drives the CPU 25 of the computer to execute a solder height detection step for scanning the surface of the solder 22 near the electrode 21 of the electronic part 18 with the light beam Lo and detecting the height of the solder 22 relative to the circuit board 15 from the scanning data of the solder 22; an electrode height detection step for scanning the surface of the electrode 21 with the light beam Lo and detecting the height of the electrode 21 relative to the circuit board 15 from the scanning data of the electrode 21; and a determination step for determining the solder joint condition between the electrode 21 and the solder 22 based on the height of the electrode 21 and the height of the solder 22 relative to the circuit board 15.

Further, the solder inspecting program of the present embodiment drives the CPU 25 of the computer to execute calculations to calculate the cross-sectional shape of the solder 22 from the scanning data obtained in the solder height detection step, and calculates the height of the solder 22 relative to the circuit board 15 based on the cross-sectional shape of the solder 22.

In addition, the solder inspecting program of the present embodiment is stored in a storage medium readable by a computer. For example, in addition to the memory 26, the storage medium may also be a hard disk, an optical disk, or a storage medium able to be accessed and readable via a LAN (Local Area Network).

As described above, in the present embodiment, the height of the bottom surface of the electrode 21 relative to the circuit board 15 and the height of the upper surface of the solder 22 relative to the circuit board 15 are measured, and the solder joint condition of the electrode 21 and the solder 22 is determined from the heights of the bottom surface of the electrode 21 and of the upper surface of the solder 22. Due to this, the solder joint condition of the electrode 21 and the solder 22 can be determined reliably with high precision, so that it is possible to improve the reliability of lack of wetting inspection performance of the solder inspection device, and improve reliability of automatic solder joint determination by using the solder inspection device.

Further, according to the present embodiment, it is possible to easily detect the height of the solder 22 relative to the circuit board 15 in an optical way. Particularly, since the height of the solder 22 relative to the circuit board 15 may be determined based on scanning data of the first scanning line on the surface of the solder 22 near the electrode 21, it is possible to obtain data for determining the solder joint condition between the electrode 21 and the solder 22 at a position where the electrode 21 and the solder 22 are closest to each other.

The present invention is applicable to a solder joint determination method, a solder inspection method, and a solder inspection device for inspecting a solder joint of an electrode of an electronic part mounted on a circuit board by soldering and the solder. Particularly, the present invention is effective in solder joint inspection of the so-called lead-free solder, which has degraded wetting performance compared to conventional solder including lead.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

What is claimed is:

1. A solder joint determination method for determining a solder joint condition between an electronic part and a piece of solder with a laser beam irradiating the electronic part, said electronic part having an electrode mounted on a circuit board by the solder, said solder joint determination method comprising:

scanning a surface of the electrode with the laser beam;
measuring a height of the electrode relative to the circuit board from data of the scanning of the electrode;
scanning a surface of the solder near the electrode with the laser beam;
measuring a height of the solder relative to the circuit board from data of the scanning of the solder; and
determining the solder joint condition between the electronic part and the solder based on the measured height of the electrode relative to the circuit board, the measured height of the solder relative to the circuit board, and a calculated distance of a bottom surface of the electrode from the circuit board that is calculated based on the measured height of the electrode relative to the circuit board.

2. The solder joint determination method as claimed in claim 1, wherein in the determining,
the solder joint condition is determined to be poor when the calculated distance of the bottom surface of the electrode from the circuit board is greater than the measured height of the solder relative to the circuit board.

3. The solder joint determination method as claimed in claim 2, wherein the calculated distance of the bottom surface of the electrode from the circuit board is calculated from a thickness of the electrode and the measured height of the electrode relative to the circuit board.

4. The solder joint determination method as claimed in claim 1, wherein in the measuring the height of the solder relative to the circuit board,
the laser beam is scanned to pass across the solder,
a cross-sectional shape of the solder is obtained from data of scanning the solder, and
the measured height of the solder relative to the circuit board is determined based on the cross-sectional shape of the solder.

5. The solder joint determination method as claimed in claim 1, wherein in the measuring the height of the solder relative to the circuit board,
the measured height of the solder relative to the circuit board is determined based on scanning data of an initial scanning line on the surface of the solder near the electrode.

6. The solder joint determination method as claimed in claim 1, wherein the solder does not include lead.

7. The solder joint determination method as claimed in claim 1, wherein in the determining,
the solder joint condition is determined to be unstable when the calculated distance of the bottom surface of the electrode from the circuit board is equal to the measured height of the solder relative to the circuit board.

8. The solder joint determination method as claimed in claim 1 further comprising:
measuring the length of the piece of solder from the data of the scanning of the piece of solder; and
determining if the length of the piece of solder is in a preset range.

* * * * *